United States Patent [19]

Kinkel

[11] Patent Number: 4,598,256
[45] Date of Patent: Jul. 1, 1986

[54] TUNED PHASE STABLE LIMITER AMPLIFIER

[75] Inventor: John F. Kinkel, Irvine, Calif.

[73] Assignee: Hughes Aircraft Company, Los Angeles, Calif.

[21] Appl. No.: 658,349

[22] Filed: Oct. 9, 1984

[51] Int. Cl.$^4$ ............................................. H03F 3/191
[52] U.S. Cl. ................................... 330/302; 330/303; 330/305; 330/306
[58] Field of Search ............... 330/252, 254, 255, 262, 330/302, 303, 304, 305, 306, 307

[56] References Cited

U.S. PATENT DOCUMENTS 3,323,070  5/1967  Hayes ............................... 330/302 X
3,571,761  3/1971  Meek ................................. 330/303 X Primary Examiner—James B. Mullins
Assistant Examiner—Steven J. Mottola
Attorney, Agent, or Firm—Thomas A. Runk; Anthony W. Karambelas

[57] ABSTRACT

A limiter amplifier having a pair of transistors connected in a common emitter, balanced push-pull amplifier type of circuit arrangement is disclosed. The transistors are interconnected by a series tuning capacitor at their emitters. A separate constant current source is connected to each of the emitters of the transistor pair. By selecting the value of the tuning capacitor to resonate with the inherent inductive component of the emitter source impedances in a particular frequency band, the limiter amplifier acts as a differential amplifier in the particular frequency band. The ac coupling of the emitters gives the limiter amplifier a bandpass filter type feature as well as high gain and low phase variation over large dynamic ranges of input signal amplitude. Impedance matching/buffer circuitry and isolation circuitry are also disclosed which permit the cascading of limiter amplifier gain stages. In a preferred embodiment of the invention, the limiter amplifier is formed in a monolithic integrated circuit and the tuning capacitor is mounted separately.

27 Claims, 4 Drawing Figures

Fig. 1.
(PRIOR ART)
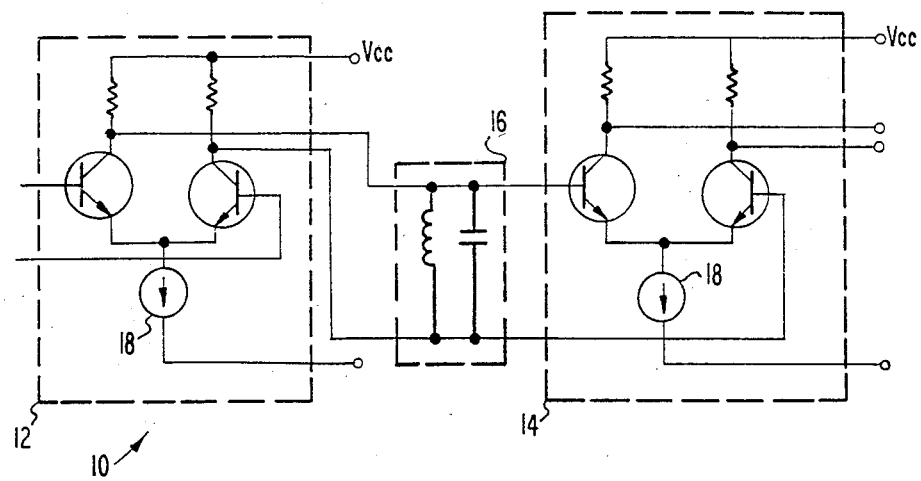
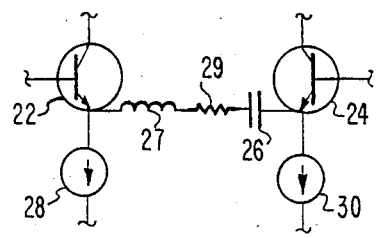
Fig. 3.
Fig. 2.
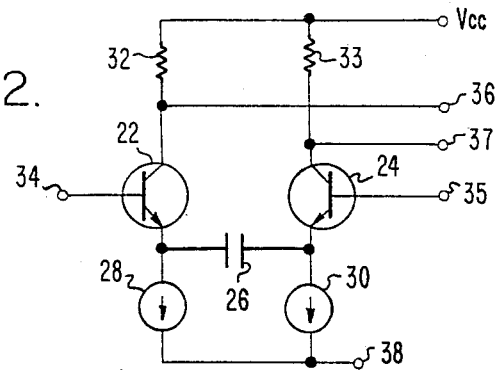

TUNED PHASE STABLE LIMITER AMPLIFIER

BACKGROUND OF THE INVENTION

The invention relates generally to transistor amplifier circuits and more particularly, to limiter amplifiers.

Limiter amplifiers provide an amplitude limited output signal in response to a variable amplitude input signal. The input signal is limited to a selected level by the limiter amplifier either by amplifying and limiting or by merely limiting. One purpose of the limiter amplifier is to remove amplitude variations from an input signal so that other signal characteristics such as frequency shift may be processed.

In certain situations, the amplitude of the input signals may vary from microvolts to volts during short time intervals. In many applications which require that these signals be amplitude limited, it is also desirable to have as little variation in phase shift as possible, i.e. where the phase shift through the limiter amplifier does not vary with input signal level. It is desirable that the phase shift through the limiter amplifier does not vary even when there are large changes in the input signal amplitude. This phase shift stability becomes very important in adaptive systems where complex weighting functions are used with quadrature channels.

In applications where both gain and limiting are required of the limiter amplifier at frequencies at or above 100 MHz, prior techniques using bipolar transistor limiter amplifiers have suffered from reduced gain at these frequencies. A reason given for the reduced gain is emitter degeneration caused by the reactance of the inductive component of the transistor emitter source impedance. One common technique used to obtain the gain required at these frequencies is to add more gain stages to the limiter amplifier to compensate for the fall-off of the gain of each stage. An increase in gain stages, however, results in an increase in components, power required, expense, complexity, size and weight.

In addition, where bandpass filtering is also required of the limiter amplifier, prior techniques have employed interstage bandpass filters which typically include discrete inductors. These bandpass filters typically have also had a power loss associated with their use. More gain may be required to compensate for this power loss with the result of more gain stages required and the disadvantages discussed above. Also, where the frequency of operation is relatively low, these discrete inductors are relatively large. The use of these inductors makes implementation of the limiter amplifier in a monolithic integrated circuit more difficult.

Accordingly, it is an object of the invention to provide an improved limiter amplifier.

It is also an object of the invention to provide a limiter amplifier having a bandpass tuning feature which is part of the limiting/amplifying circuitry.

It is also an object of the invention to provide a limiter amplifier having a high degree of phase stability throughout the dynamic range of the input signal.

It is also an object of the invention to provide a limiter amplifier which has higher gain per stage and which is cascadable with other limiter amplifiers.

It is also an object of the invention to provide a limiter amplifier which is better adapted to construction in a monolithic integrated circuit.

SUMMARY OF THE INVENTION

The foregoing objects and other objects are attained wherein there is provided in accordance with the invention a limiter amplifier comprising a pair of bipolar transistors arranged in a common emitter, balanced push-pull amplifier type of configuration with their emitters coupled together through a tuning capacitor. The capacitance value of the tuning capacitor is selected so as to series resonate with the inductive components of the emitter source impedances of the two bipolar transistors in a particular frequency band. A constant current source is connected to the emitter of each transistor.

Capacitively coupling the emitters of the transistors in accordance with the invention and using constant current sources in each emitter circuit results in a differential amplifier type of configuration for the particular frequency band. By using the capacitor to resonate out the inherent inductance of the emitters of the transistors in the particular frequency band, increased gain of the limiter amplifier is obtained. Also, because the emitters are capacitively coupled, the limiter amplifier acts as a series resonant bandpass filter rejecting signals of frequencies outside the band. Selecting the value of the capacitor to result in resonance at the center frequency of the particular frequency pass band results in a limiter amplifier which amplifies, limits and filters.

By configuring the transistors in a balanced push-pull configuration in accordance with the invention, there is very low even order nonlinearity and a phase stable limiter amplifier results for input signals of large dynamic range. Because of the use of the limiting/amplifying transistors to perform a bandpass filtering function in accordance with the invention, external bandpass filters may not by required between gain stages. Additionally, a limiter amplifier in accordance with the invention is particularly suitable for construction in a monolithic semiconductor substrate and hybrid assembly.

BRIEF DESCRIPTION OF THE DRAWINGS

The various features and advantages of the invention together with further features, advantages, and objects thereof are described with more precision in the following detailed description taken in conjunction with the accompanying drawings, in which:

FIG. 1 is a schematic circuit diagram showing two gain stages of a prior art differential type limiter amplifier coupled together by a bandpass filter;

FIG. 2 is a schematic circuit diagram of a limiter amplifier in accordance with the invention showing the tuning capacitor connecting together the emitters of the two bipolar transistors, and also showing the constant current sources connected to the emitters;

FIG. 3 is a figurative diagram of the operation of the tuning capacitor with the transistors.

DETAILED DESCRIPTION OF THE INVENTION

Figure 4:
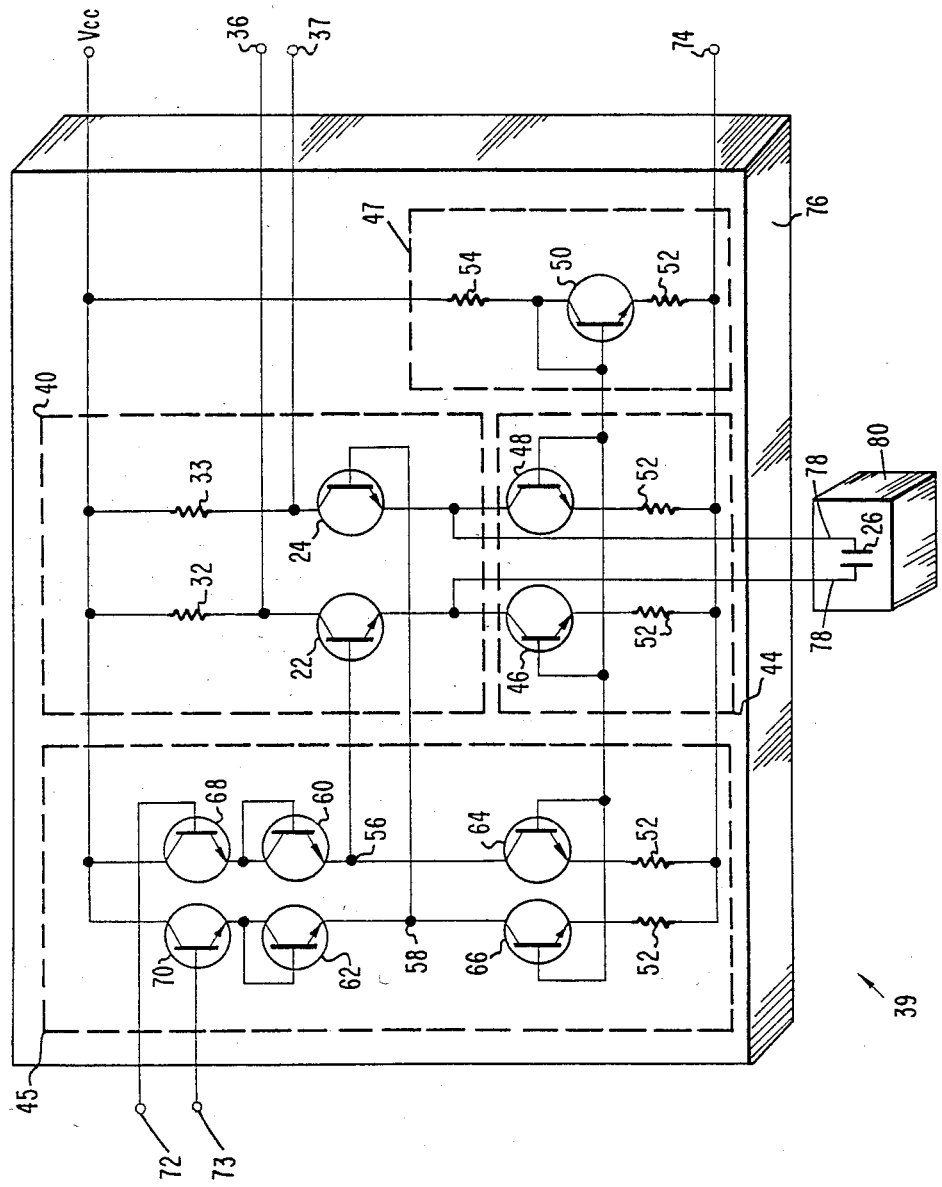
FIG. 4 is a schematic block diagram of an embodiment of the invention.

In the following description, like reference numerals will be used to refer to like elements in the different figures of the drawings where appropriate. Referring now to FIG. 1 with more particularity, there is shown a prior art limiter amplifier 10 having two gain cells 12 and 14 connected together through a bandpass filter arrangement 16. This bandpass filter 16 contains an inductor in parallel with a capacitor to establish the frequency passband. In FIG. 1, dc differential type amplifiers are shown as being used for the gain stages 12 and 14. These amplifiers have their emitters directly coupled together and have constant current sources 18 coupled to the common emitter line. DC differential amplifiers are useful as limiter amplifiers because of the excellent limiting they provide when they are overdriven as well as their operating point stability brought about by their common emitter configuration. Imbalances in one transistor are compensated for by the other transistor such that, typically, neither temperature variation, power supply drift, nor changes in resistances cause drift of the operating point of the limiter amplifier. For a more detailed discussion of dc differential amplifiers, refer to L. J. Giacoletto, *Differential Amplifiers*, Wiley-Interscience, 1970.

Although not intending to be bound by theory, it is believed that certain features of the invention result in accordance with the theoretical discussions contained herein. In the prior technique shown in FIG. 1, available gain is limited in part by the inductive component of the emitter impedance of each transistor. At higher frequencies, the reactance of this inductance causes gain degeneration. Where the operating frequency of the limiter amplifier is in the higher frequency ranges where emitter degeneration causes a fall-off of gain, more gain stages may be required to compensate for the lower gain per stage. Adding gain stages may be undesirable due to the increase in components, the increase in size, higher power requirements and reduced reliability.

Also, the use of the external bandpass filter 16 as shown in FIG. 1 causes a power loss as well as a physically larger circuit due to the use of a tuning inductor. This power loss may cause a requirement for more gain stages in order to result in the overall gain needed. The use of a tuning inductor makes construction of the limiter amplifier circuit in a reduced size circuit more difficult. Where the operating frequency is low, the size of the tuning inductor will be relatively large.

Referring now to FIG. 2, there is shown a schematic diagram of an embodiment of a limiter amplifier 20 in accordance with the invention. Two bipolar transistors 22 and 24 are interconnected at their emitters by a series tuning capacitor 26. Each transistor 22 and 24 also has a constant current source 28 and 30 respectively coupled to its emitter. Resistors 32 and 33 are connected to the collectors of the transistors 22 and 24 respectively and are used for loads. The common line 38 connects the constant current sources 28 and 30. The bases of the transistors 22 and 24 are coupled to the input terminals 34 and 35 and the collectors are coupled to the output terminals 36 and 37.

The configuration of FIG. 2 has many of the advantages of a common emitter, balanced push-pull configuration. As an example, it will have the reduced even order harmonic distortion common to such a configuration. It is also a differential amplifier type of configuration although the emitters of the transistors 22 and 24 are not dc coupled as are those in FIG. 1. The tuning capacitor 26 connected between the emitters of the transistors 22 and 24 results in ac coupling and blocks the passage of quiescent dc between the emitters thereby increasing the stability of a limiter amplifier built in accordance with the invention since there will be no dc gain. The limiter amplifier embodiment of FIG. 2 is of a differential amplifier type of configuration at certain frequencies as determined by the value of the tuning capacitor 26.

In addition to increasing stability due to eliminating dc gain, the tuning capacitor 26 has several other features. In the invention, an increase in gain of the limiter amplifier 20 is obtained due to "resonating out" the inductive component of the emitter source impedance of the transistors with the tuning capacitor 26. This is figuratively shown in FIG. 3 where tuning capacitor 26 is coupled in series with the inherent inductance 27 and the inherent resistance 29, all of which are in series between the emitters of the transistors 22 and 24. Inherent inductance 27 is a representation of the inductive component of the emitter source impedances of both transistors 22 and 24. Inherent resistance 29 is a representation of the resistances of the emitters of both transistors 22 and 24. When coupling the emitters directly together as shown in FIG. 1 without the tuning capacitor 26, the impedance between the two emitters could be represented by:

$$Z_e = jwL + R_e \tag{1}$$

where:
$L$ = the inherent inductance 27
$R_e$ = the inherent resistance 29
$w$ = radian frequency Thus at the higher operating frequencies, the jwL term will become significant and will add to the impedance between the emitters.

Adding the tuning capacitor 26 in accordance with the invention results in an impedance shown in FIG. 3 and which may be represented by:

$$Z_e = jwL + R_e - j/wC \tag{2}$$

where:
$C$ = the value of the tuning capacitor 26.

Thus by selecting the value of C so that at the particular frequency of interest, the C term cancels the L term in equation (2), an impedance value of $R_e$ remains. This impedance value will be lower than the impedance value of equation (1) at the higher operating frequencies and so will permit a higher gain for the amplifier 20. Fewer gain stages are required of a limiter amplifier constructed in accordance with the invention due to this availability of increased gain.

As indicated above, the tuning capacitor 26 also takes advantage of the inductive component of the inherent emitter source impedance to accomplish a series resonant bandpass filter function. As is shown in equation (2) above, the capacitance value of the tuning capacitor 26 is selected to resonate with the inductive components 27 in a particular frequency band. By resonating out the inductive component 27, the emitters of the transistors 22 and 24 are coupled in a differential amplifier type of configuration with only the inherent resistance 29 in series. Thus the limiter amplifier 20 in accordance with the invention, will act as a differential amplifier in that frequency band. For example, a signal in that frequency band may be applied to the input terminals 34 and 35 of the limiter amplifier 20 by a trifilar transformer. By means of this transformer, the input terminals 34 and 35 receive the same signal 180° out of phase from each other. Where the frequency of the signal exceeds the time constant of the tuning capacitor 26, current from both constant current sources 28 and 30 will be available to the more conducting transistor and an output will result from the limiter amplifier 20. For example, if that signal input to the limiter amplifier 20 is strong enough to drive one transistor 22 into saturation and the other transistor 24 into cutoff, the constant current source 30 of the cutoff transistor 24 will be available to the saturated, conducting transistor 22 and an output may be extracted from its collector at the output terminal 36.

Outside of that frequency band, the limiter amplifier 20 in accordance with the invention does not operate as described above. Outside of the frequency band, the tuning capacitor 26 does not completely resonate out the inherent inductance 27 and a relatively large impedance remains between the two emitters. The constant current source of the respective transistor maintains the current at the selected amount and current from the current source of the paired transistor is not available. Thus, outside the particular frequency band, signals are rejected while inside the band, difference signals are amplified and limited.

It has been found that this bandpass filtering function of the limiter amplifier constructed in accordance with the invention has a further advantage. In prior limiter amplifier techniques where interstage bandpass filters were used as shown in FIG. 1, increased phase shift variation through the limiter amplifier as a function of input signal level provided undesirable results in many applications. It is believed that this reaction occurs at least in part because the amplifiers used in prior techniques function as low pass filters at the higher operating frequencies since the amplifier gain falls off. It has been found that low pass filters typically have higher even order nonlinearity resulting in higher phase shift variation than bandpass filters have. In the invention, the tuning capacitor 26 has resulted in the limiter amplifier 20 also functioning as a bandpass filter. This results in lower even order nonlinearity and less phase shift variation as a function of input signal amplitude for a limiter amplifier constructed in accordance with the invention than with prior techniques.

Referring now to FIG. 4, a preferred embodiment of the invention is shown in schematic and block diagram form. In FIG. 4, a limiter amplifier 39 in accordance with the invention is shown comprising a limiting/amplifying circuit 40, a constant current source circuit 44, an impedance matching/buffer circuit 45, and a bias circuit 47. These are shown in block representation form of circuit element location which has a practical application to monolithic integrated circuit construction.

In FIG. 4, the limiting/amplifying circuit 40 comprises two bipolar limiter transistors 22 and 24, two load resistors 32 and 33 coupled to the collectors of the limiter transistors 22 and 24 respectively, and a tuning capacitor 26 connected in series between the emitters of the limiter transistors 22 and 24. The outputs 36 and 37 of the limiter amplifier 39 are taken from the respective collectors of the limiter transistors 22 and 24. The inputs 56 and 58 to the limiting/amplifing circuit 40 are applied to their respective bases.

Constant current sources for the limiter transistors 22 and 24 are located in the constant current circuit 44. Each constant current source comprises a common emitter transistor 46 and 48 which has its bias point set by the bias circuit 47. As is shown, the bases of the constant current source transistors 46 and 48 are connected to the base and collector of the bias transistor 50 located in the bias circuit 47. The emitters of the constant currents source transistors 46 and 48 contain bias resistors 52 connected to common 74 for setting the current through the collector and emitter and resulting in stability by means of the feedback generated.

The bias transistor 50 has its collector shunted to its base to form a diode and has a collector resistor 54 coupled to the high potential $V_{cc}$ of the circuit and an emitter resistor 52 coupled to common 74 to establish the bias for the current source transistors 46 and 48. By coupling the base of the bias transistor 50 to the bases of the constant current source transistors 46 and 48, the currents through the collectors and emitters of the limiter transistors 22 and 24 and of the constant current source transistors 46 and 48 are established.

The inputs 56 and 58 of the limiting/amplifying circuit 40 are coupled to the emitters of the isolation transistors 68 and 70 respectively through the level shifting transistors 60 and 62 respectively which have been connected as diodes in this embodiment. The isolation transistors 68 and 70 are a part of the impedance matching/buffer circuit 45 which enables the cascading of a plurality of limiter amplifier circuits such as that shown in FIG. 4. The level shifting transistors 60 and 62 in particular permit direct coupling of gain stages due to the additional bias voltage drop across them. To connect them as diodes, their collectors have been shunted to their bases. In the emitter circuit of these level shifting transistors 60 and 62, there are constant current sources comprising common emitter transistors 64 and 66 respectively. These constant current sources are configured in the same manner as those constant current sources 46 and 48 in the limiting/amplifying circuit 40. The bases of these constant current source transistors 64 and 66 are connected to the base of the bias transistor 50 for establishing the amount of current through their emitters. Additionally, the emitters of the constant current source transistors 64 and 66 contain resistors 52 for feedback purposes and for controlling the collector current.

The collectors of the diode connected level shifting transistors 60 and 62 are connected to the emitters of the isolation transistors 68 and 70 respectively. These isolation transistors 68 and 70 are coupled at their bases to the input signal terminals 72 and 73 respectively and are biased by connection at their collectors to the high potential source $V_{cc}$. These isolation transistors 68 and 70 function as common collector (emitter follower) amplifiers.

As is also shown in FIG. 4, the limiting/amplifying circuit 40, constant current source circuit 44, impedance matching/buffer circuit 45, and bias circuit 47 are located on a common limiter amplifier slab 76 which may take the form of a monolithic integrated circuit. The tuning capacitor 26 is located on a separate tuning capacitor slab 80. Electrical emitter lines 78 have been brought out from the emitters of the limiter transistors 22 and 24 which are located on the limiter amplifier slab 76 to the tuning capacitor slab 80 on which the tuning capacitor 26 is mounted. By this arrangement, fine tuning of the limiter amplifier 39 is facilitated and physical contact with the main limiter amplifier circuitry located on the limiter amplifier slab 76 is not required for the tuning. Where the value of the inductive components of the emitter source impedances of the limiter amplifier transistors 22 and 24 are not known, the selection of the correct capacitance value for the tuning capacitor 26 may be made experimentally by substituting different capacitors on the tuning capacitor slab 80 in connection with the emitter lines 78 until the correct bandpass frequency is obtained. In this way, the limiter amplifier slab 76 may be constructed in a monolithic semiconductor substrate with contacts conveniently located on it for attaching electrical lines 78 to connect the tuning capacitor 26 located on a different part of the same slab or on a separate tuning capacitor slab 80 to the emitters of the limiter transistors 22 and 24. The two slabs 76 and 80 may be inserted in a hybrid type circuit board arrangement. Where a plurality of gain stages are required to meet an overall gain requirement, a plurality of circuits shown on the limiter amplifier slab 76 in FIG. 4 may be combined into a single monolithic semiconductor substrate. Contacts may be placed on this semiconductor substrate for connection to the plurality of external tuning capacitors 26, the power supplies, input/output terminals, terminals for common and other terminals as required.

Thus a limiter amplifier constructed in accordance with the invention obviates the use of interstage bandpass filters such as that shown in FIG. 1 by numeral 16. The bandpass filtering is performed as part of the limiting and amplifying function by the capacitively coupled differential pair of bipolar transistors 22 and 24. By not using a tuning inductor between stages, the number of components required to achieve the frequency filtered output signal is reduced. Additionally, a circuit in accordance with the invention is adapted to monolithic integrated circuit and hybrid type circuit board construction resulting in reduced size, and ease and consistency in construction. No discrete inductors are required for frequency filtering and the tuning capacitor used may be a chip type having a relatively small size and weight. Because stage intermediate bandpass filters are not used, and because the inductive component of the emitter source impedance of the transistors is resonated out by the tuning capacitor, higher gain at higher frequencies results from the use of a limiter amplifier constructed in accordance with the invention. Also, a limiter amplifier constructed in accordance with the invention has very low even order nonlinearity with good phase stability due to its balanced push-pull type of configuration.

A working embodiment of the invention was constructed having four gain stages such as that shown in FIG. 4. The circuit was constructed in a monolithic semiconductor integrated circuit using a 4.5 $f_t$ GHz bipolar process for all transistors shown. The size of the transistors and the operating emitter currents were selected to result in a high gain bandwidth product while keeping the power requirements low. This integrated circuit chip was mounted on a "chip and wire" ceramic substrate hybrid with separate slabs 80 on which were mounted tuning capacitors 26. The ceramic substrate was made of alumina which is available from Materials Research Corporation, Orangeburg, New York. The bias collector currents of the limiter transistors 22 and 24 were approximately 2.5 milliamperes. The collector resistors 32 and 33 and emitter resistors 52 were approximately 200 ohms. This selection of resistor values and currents resulted in a voltage swing across the collector resistors 32 and 33 of approximately one volt. The collector resistor 54 of the bias transistor 50 was approximately 1.4 kilohms.

The embodiment was tuned for a center frequency of 130 MHz for which 68 picofarad tuning capacitors 26 were required. Measured gain per gain stage was approximately 18 dB and overall limiter amplifier gain for all four gain stages was approximately 72 dB. This gain compares advantageously with the results obtained in an embodiment where circuits constructed in accordance with FIG. 1 were cascaded to form a limiter amplifier. That cascade produced gain of only 12 dB per gain stage and more than four stages were required to result in 72 dB overall gain. It is believed that the large difference in gain was caused in large part by emitter degeneration affecting the FIG. 1 circuit. As discussed above, this emitter degeneration has been controlled in the invention. The 3 db bandwidth of the embodiment constructed in accordance with the invention was approximately 100 MHz. The phase shift variation over an input signal amplitude range of −70 dBm to 0 dBm was within ±15 degrees. The change in output amplifier over this input range was 3 dB peak to peak. Input signals of −70 dBm were amplified and slightly limited by the fourth gain stage in the embodiment while input signals of 0 dBm were limited in the first gain stage.

It was found that the use of double base connections was beneficial in that they reduced extrinsic base resistance and resulted in better bandwidth performance and reduced noise figure. Also, it was found that matched limiter transistors 22 and 24 are preferable. Thus, on the monolithic circuit layout, they are located close together to obtain very similar characteristics. The balanced, symmetrical circuit such as that shown in FIG. 2 as numeral 20 was found to have reduced even order nonlinearity and better phase variation performance.

Although the invention has been described in detail, it is anticipated that modifications and variations may occur to those skilled in the art which do not depart from the inventive concepts. It is intended that the invention be limited only by the scope of the claims, not by the description, and so the invention will include such modifications and variations unless the claims limit the invention otherwise.

What is claimed is:

1. A tuned limiter amplifier comprising:
   first and second circuit branches each having a bipolar transistor having an emitter source impedance with an inductive component thereof and a constant current circuit connected with the emitter of the transistor in a series circuit relationship;
   a capacitor connected to the first circuit branch between the emitter and the constant current circuit and connected to the second circuit branch between the emitter and the constant current circuit; and
   the capacitor having a capacitance value selected so that it resonates with the inductive components of the emitter source impedances of both transistors in a selected frequency band thereby forming a bandpass filter;
   whereby a balanced push-pull circuit is formed which is tuned by the capacitor.

2. The limiter amplifier of claim 1 wherein the capacitor substantially blocks the passage of quiescent dc between the emitters of the first and second transistors.

3. The limiter amplifier of claim 1 wherein the transistors and the constant current circuits are formed in a monolithic semiconductor substrate.

4. The limiter amplifier of claim 3 wherein the capacitor is disposed at a position removed from the transistors.

5. The limiter amplifier of claim 1 further comprising first means for applying a first potential to the collector of the transistor of the first branch.

6. The limiter amplifier of claim 5 further comprising second means for applying a second potential to the collector of the transistor of the second branch.

7. The limiter amplifier of claim 5 wherein the first means comprises a first resistor connected between the collector of the transistor of the first branch and the first potential.

8. The limiter amplifier of claim 6 wherein the second means comprises a second resistor connected between the collector of the transistor of the second branch and the second potential.

9. The limiter amplifier of claim 8 wherein the first and second potentials are equal.

10. The limiter amplifier of claim 1 wherein the constant current circuit of the first branch comprises:
a third transistor having a base, a collector, and an emitter, the collector of the third transistor being coupled to the emitter of the transistor of the first branch;
means for resistively coupling the emitter of the third transistor to a third potential; and
means for controllably applying a fourth potential to the base of the third transistor to control the potential of the base in relation to the third potential so that a selected amount of current flows through the emitter of the transistor of the first branch.

11. The limiter amplifier of claim 10 wherein the constant current circuit of the second branch comprises:
a fourth transistor having a base, a collector, and an emitter, the collector of the fourth transistor being coupled to the emitter of the transistor of the second branch;
means for resistively coupling the emitter of the fourth transistor to a fifth potential; and
means for controllably applying a sixth potential to the base of the fourth transistor to control the potential of the base in relation to the fifth potential so that a selected amount of current flows through the emitter of the transistor of the second branch.

12. A tuned limiter amplifier comprising:
first and second bipolar transistors, each having a base, a collector, and an emitter, and each having an emitter source impedance with an inductive component thereof;
first collector means for connecting the collector of the first transistor to a first potential;
second collector means for connecting the collector of the second transistor to a second potential;
first input means for applying an input signal to the base of the first transistor;
first and second output means for extracting output signals from the collectors of the first and second transistors respectively;
first and second current means for applying constant dc bias to the emitters of the first and second transistors respectively; and
emitter coupling means for capacitively coupling the emitter of the first transistor to the emitter of the second transistor wherein the capacitance of the emitter coupling means is selected to resonate with the inductive components of the emitter source impedances of the first and second transistors in a selected frequency band thereby forming a bandpass filter;
whereby a balanced push-pull circuit is formed which is tuned by the emitter coupling means.

13. The limiter amplifier of claim 12 wherein the emitter coupling means is also for substantially blocking the passage of quiescent dc between the emitters of the first and second transistors.

14. The limiter amplifier of claim 12 wherein the emitter coupling means comprises a capacitor connected in series between the emitter of the first transistor and the emitter of the second transistor, the capacitance value of the capacitor being selected so that the frequency of resonation with the inductive components of the emitter source impedances of the first and second transistors will occur in the selected frequency band.

15. The limiter amplifier of claim 14 wherein the first and second transistors and the first and second current means are formed in a monolithic semiconductor substrate.

16. The limiter amplifier of claim 15 wherein the emitter coupling means is disposed at a position removed from the first and second transistors.

17. The limiter amplifier of claim 12 further comprising second input means for applying an input signal to the base of the second transistor.

18. The limiter amplifier of claim 12 wherein the first collector means comprises a first resistor connected between the collector of the first transistor and the first potential.

19. The limiter amplifier of claim 18 wherein the second collector means comprises a second resistor connected between the collector of the second transistor and the second potential.

20. The limiter amplifier of claim 12 wherein the first and second potentials are equal.

21. The limiter amplifier of claim 12 wherein the first current means comprises:
a third transistor having a base, a collector, and an emitter, the collector of the third transistor being coupled to the emitter of the first transistor;
means for resistively coupling the emitter of the third transistor to a third potential; and
means for controllably applying a fourth potential to the base of the third transistor to control the potential of the base in relation to the third potential so that a selected amount of current flows through the emitter of the first transistor.

22. The limiter amplifier of claim 21 wherein the second current means comprises:
a fourth transistor having a base, a collector, and an emitter, the collector of the fourth transistor being coupled to the emitter of the second transistor;
means for resistively coupling the emitter of the fourth transistor to a fifth potential; and
means for controllably applying a sixth potential to the base of the fourth transistor to control the potential of the base in relation to the fifth potential so that a selected amount of current flows through the emitter of the second transistor.

23. The limiter amplifier of claim 22 wherein the third potential is substantially equal to the fifth potential.

24. A tuned limiter amplifier comprising:
first and second transistors, each having a base, a collector, and an emitter, and each having an emitter source impedance with an inductive component thereof;
first collector means for connecting the collector of the first transistor to a first potential including a first resistor connected between the collector and the first potential;
second collector means for connecting the collector of the second transistor to a second potential including a second resistor connected between the collector and the second potential;

first and second input means for applying input signals to the bases of the first and second transistors respectively;

first and second output means for extracting output signals from the collectors of the first and second transistors respectively;

first and second current means for applying constant dc bias to the emitters of the first and second transistors respectively;

a monolithic semiconductor substrate into which is formed the first and second transistors and the first and second current means; and a capacitor connected in series between the emitters of the first and second transistors and having a capacitance value selected so that the capacitor resonates with the inductive components of the emitter source impedances of the first and second transistors in a selected frequency band thereby forming a bandpass filter, the capacitor being disposed at a position removed from the first and second transistor;

whereby a balanced push-pull circuit is formed which is tuned by the capacitor.

25. The limiter amplifier of claim 24 wherein the capacitor substantially blocks the passage of quiescent dc between the emitters of the first and second transistors.

26. The limiter amplifier of claim 24 wherein the first current means comprises:

a third transistor having a base, a collector, and an emitter, the collector of the third transistor being coupled to the emitter of the first transistor;

means for resistively coupling the emitter of the third transistor to a third potential; and means for controllably applying a fourth potential to the base of the third transistor to control the potential of the base in relation to the third potential so that a selected amount of current flows through the emitter of the first transistor.

27. The limiter amplifier of claim 26 wherein the second current means comprises:

a fourth transistor having a base, a collector, and an emitter, the collector of the fourth transistor being coupled to the emitter of the second transistor;

means for resistively coupling the emitter of the fourth transistor to a fifth potential; and means for controllably applying a sixth potential to the base of the fourth transistor to control the potential of the base in relation to the fifth potential so that a selected amount of current flows through the emitter of the second transistor.

* * * * *

UNITED STATES PATENT AND TRADEMARK OFFICE
CERTIFICATE OF CORRECTION

PATENT NO. : 4,598,256

DATED : July 1, 1986

INVENTOR(S) : John F. Kinkel

It is certified that error appears in the above-identified patent and that said Letters Patent is hereby corrected as shown below:

In the "References Cited", add the following:

--U.S. PATENT DOCUMENTS

| | | | |
|---|---|---|---|
| 3,416,088 | 12/85 | J.L.E. Baldwin | 330/3 |
| 3,840,756 | 10/74 | W.H. Jones | 307/264 |
| 3,942,181 | 3/76 | F. Berrod | 343/16 |
| 4,267,518 | 5/81 | W.W. Davis | 330/254 |
| 4,342,005 | 7/82 | J.R. Harford | 330/254 |
| 3,953,849 | 4/76 | J.B. Couvillon | 343/7A |
| 4,431,970 | 2/84 | T. Sumi et al. | 329/103 |

OTHER PUBLICATIONS

W.L. Barber and E.R. Brown, A TRUE LOGARITHMIC AMPLIFIER FOR RADAR IF APPLICATIONS, IEEE Journal of Solid-State Circuits, Vol. SC-15, No. 3, June 1980, pgs. 291-295

E. MacPherson, A SEMI-CUSTOM IC FOR AN ADVANCED ECM SYSTEM, Microwave Journal, September 1981, pgs. 91-94, 96-98

D. Clifford, APPROXIMATING TRUE LOG OUTPUT AT HIGH FREQUENCIES, Electronics, January 31, 1972, pgs. 70-72

UNITED STATES PATENT AND TRADEMARK OFFICE
CERTIFICATE OF CORRECTION

PATENT NO. : 4,598,256

DATED : July 1, 1986

INVENTOR(S) : John F. Kinkel

It is certified that error appears in the above-identified patent and that said Letters Patent is hereby corrected as shown below:

OTHER PUBLICATIONS CONT.

W. Calaway, THE DESIGN OF WIDEBAND LIMITING CIRCUITS, EDN, December 1965, beginning at page 42--

In the specification, column 8, line 15, replace "amplifier" with --amplitude--.

Signed and Sealed this

Eighth Day of September, 1987

Attest:

DONALD J. QUIGG

*Attesting Officer*  *Commissioner of Patents and Trademarks*